United States Patent [19]
Haluska et al.

[11] Patent Number: 4,849,296
[45] Date of Patent: Jul. 18, 1989

[54] MULTILAYER CERAMIC COATINGS FROM METAL OXIDES AND HYDROGEN SILSESQUIOXANE RESIN CERAMIFIED IN AMMONIA

[75] Inventors: Loren A. Haluska; Keith W. Michael, both of Midland; Leo Tarhay, Sanford, all of Mich.

[73] Assignee: Dow Corning Corporation, Midland, Mich.

[21] Appl. No.: 138,744

[22] Filed: Dec. 28, 1987

[51] Int. Cl.$^4$ ............................................. B32B 15/04
[52] U.S. Cl. ..................................... 428/457; 427/38; 427/58; 427/99; 427/240; 427/249; 427/255.2; 427/255.7; 427/346; 427/380; 427/404; 427/421; 427/430.1; 428/688; 428/704
[58] Field of Search ................. 427/38, 58, 99, 240, 427/249, 255.2, 255.7, 421, 346, 430.1, 404, 380; 428/457, 688, 704

[56] References Cited
U.S. PATENT DOCUMENTS 3,615,272 10/1971 Frye et al. ............................. 23/366

OTHER PUBLICATIONS

Frye, et al., "The Oligomeric Silsesquioxanes, (HSiO$_{3/2}$)$_n$" (1970), J. Am. Chem. Soc., p. 5586.
Glaser, et al., "Effect of the H$_2$O/Teos Ratio upon the Preparation and Nitridation of Silica Sol/Gel Films", (1984), J. of Non-Crystalline Solids, 63, 209-221.
Brow and Pantano, "Thermochemical Nitridation of Microporous Silica Films in Ammonia", (1987), J. Am. Ceram. Soc., 70, 9-14.

Primary Examiner—Bernard Pianalto
Attorney, Agent, or Firm—James E. Bittell

[57] ABSTRACT

Mixtures of hydrogen silsesquioxane resin and metal oxide precursors such as acyloxy and alkoxy compounds of aluminum, zirconium, and titanium can be coated on substrates and subsequently ceramified at low temperature in the presence of ammonia, with or without platinum or rhodium catalysis, to form a nitrided ceramic coating on the surface of the substrate. The nitrided coatings produced are useful as interlevel dielectric films or for planarizing and protecting the surface of electronic devices. For further surface protection, overcoating the nitrided coating with an additional layer of a passivating ceramic material and a top layer of a barrier ceramic material is also described.

24 Claims, No Drawings

MULTILAYER CERAMIC COATINGS FROM METAL OXIDES AND HYDROGEN SILSESQUIOXANE RESIN CERAMIFIED IN AMMONIA

BACKGROUND OF THE INVENTION

This invention relates to ceramic coatings for the protection of the surfaces of substrates such as electronic devices like integrated circuits on semiconductor chips. The invention also relates to ceramic coatings used to form interlevel dielectric films to isolate metallization layers in electronic devices.

A common cause of failure of electronic devices is microcracks or voids in the surface passivation of the semiconductor chip allowing the introduction of impurities. Thus a need exists for improved protective coatings which will resist the formation of microcracks, voids or pinholes even during use in stressful environments.

Passivating coatings on electronic devices can provide barriers against ionic impurities, such as chloride ion ($Cl^-$) and sodium ion ($Na^+$), which can enter an electronic device and disrupt the transmission of electronic signals. The passivating coating can also be applied to electronic devices to provide some protection against moisture and volatile organic chemicals.

It is known to use planarizing interlayers within the body of an electronic device between the metallization layers. Gupta and Chin (Microelectronics Processing, Chapter 22, "Characteristics of Spin-On Glass Films as a Planarizing Dielectric", pp. 349-65, American Chemical Society, 1986) have shown multilevel interconnect systems with isolation of metallization levels by interlevel dielectric insulator layers of doped or undoped $SiO_2$ glass films. Spin-on glass films have been utilized to provide interlayer isolation between the metallization layers, the top layer of which is later patterned by lithographic techniques.

Glasser et al. ("Effect Of The $H_2O$/TEOS Ratio Upon The Preparation And Nitridation of Silica Sol/Gel Films", Journal of Non-Crystalline Solids 63, (1984) p. 209-221) utilized solutions of hydrolyzed tetraethoxysilane (TEOS), and not hydrogen silsesquioxane resin, to produce silica sol/gel films which were subsequently subjected to thermal treatment and nitridation in an ammonia atmosphere. Glasser et al. suggests that the nitrided silica sol/gel films may be useful oxidation barriers for silicon and other metal surfaces.

Brown and Pantano, Journal of the American Ceramic Society, 70(1) pp. 9-14, 1987, discloses the thermochemical nitridation of microporous silica films in ammonia using so-called "sol gels" derived from tetraethoxysilane as the starting material. Brown and Pantano does not teach the use of hydrogen silsesquioxane resin as the starting material, nor does it teach the low temperature process claimed herein.

Rust et al., U.S. Pat. No. 3,061,587, issued Oct. 30, 1963, teaches a process for forming ordered organo silicon-aluminum oxide copolymers by reacting dialkyl diacyloxysilane or dialkyl dialkoxysilane, with trialkylsiloxy dialkoxy aluminum.

Frye and Collins teach in U.S. Pat. No. 3,615,272, issued Oct. 26, 1971, and also in Frye, et al., J. Am. Chem. Soc., 92, p. 5586, 1970, the formation of hydrogen silsesquioxane resin.

The inventors have recently filed several patent applications on inventions related to the formation of ceramic coatings for the protection of electronic devices. These patent applications include: Ser. No. 938,679, titled "Multilayer Ceramics From Silicate Esters", filed Dec. 4, 1986 in the names of Loren Haluska, Keith Michael, and Leo Tarhay; Ser. No. 937,274, titled "Multilayer Ceramics From Hydrogen Silsesquioxane", filed Dec. 3, 1986 in the names of Loren Haluska, Keith Michael, and Leo Tarhay; Ser. No. 937,276, titled "SiN-Containing Coatings For Electronic Devices", filed Dec. 3, 1986 in the names of Ronald Baney, Loren Haluska, Keith Michael, Sarah Snow, and Leo Tarhay; Ser. No. 937,273 titled "Platinum and Rhodium Catalysis of Low Temperature Formation Multilayer Ceramics", filed on Dec. 3, 1986 in the names of Loren Haluska, Keith Michael, and Leo Tarhay; Ser. No. 000,217, titled "Multilayer Ceramic Coatings From Silicate Esters and Metal Oxides", filed on Jan. 2, 1987 in the names of Loren Haluska, Keith Michael, and Leo Tarhay; Ser. No. 938,678, titled "Platinum or Rhodium Catalyzed Multilayer Ceramic Coatings From Hydrogen Silsesquioxane Resin and Metal Oxides", filed on Dec. 4, 1986 in the names of Loren Haluska, Keith Michael, and Leo Tarhay; and Ser. No. 938,677, titled "Multilayer Ceramic Coatings From Metal Oxides for Protection of Electronic Devices", filed on Dec. 4, 1986, in the names of Loren Haluska, Keith Michael, and Leo Tarhay.

SUMMARY OF THE INVENTION

The instant invention relates, in one embodiment, to a process for the low temperature formation of single-layer and/or multilayer coatings for the protection of surface features of sensitive substrates such as electronic devices. In a second embodiment the invention relates to the formation of interlevel dielectric films as used in electronic devices where electronic functions are built up and occur in multiple metallized layers separated electrically by interlevel dielectric films. The coating methods of this invention are especially effective in providing protection for surfaces having irregular features such as a CMOS device having bond pad attachments and an etch pattern.

In the present invention, a method is described for forming a planarizing first layer of a nitrided coating containing silicon dioxide and zirconium, aluminum, and/or titanium oxide on a substrate surface. The coating of nitrided silicon and other metal oxides provides substantial surface protection as a single-layer and can be used independent of other overcoat layers or can be used as the first layer of a multilayer protective coating system. Alternatively, a nitrided coating of silicon and other metal oxides provides a dielectric film which, after overcoating with a metallization layer, functions as an interlevel dielectric layer.

Nitrided coatings are obtained according to the present invention by first applying a solution containing a mixture of hydrogen silsesquioxane resin $(HSiO_{3/2})_n$ and metal oxide precursors of zirconium, aluminum, and/or titanium, with or without platinum or rhodium catalysts, to the surface of a substrate and then heat treating the coating in an ammonia atmosphere to effect conversion to the nitrided coating of silicon dioxide and zirconium, aluminum, and/or titanium oxides.

The dual-layer coatings of the present invention consist of (1) a first layer of the nitrided planarizing coating as described above, and (2) a second coating layer of silicon, silicon-nitrogen, silicon-carbon, or silicon-carbon-nitrogen ceramic or ceramic-like material as further described hereafter. The second layer is formed over the first coating layer by either of two methods. In one option, the second coating layer is formed by applying a preceramic polymer over the surface of the first layer, typically using a conventional flow coating technique with the preceramic polymer dissolved in a solvent which subsequently evaporates. The polymer coating is then converted to a ceramic or ceramic-like layer by a subsequent heat treatment. Alternatively, the second layer can be a silicon, silicon-nitrogen, silicon-carbon-nitrogen, or silicon-carbon ceramic layer deposited directly by a chemical vapor deposition process.

The instant invention also relates to the formation of a three layer coating system for the protection of electronic devices wherein the first layer is the nitrided planarizing coating as described above and the second layer is any of the ceramic coatings described above.

The third layer in the three layer coatings of the present invention is a top coating of (a) amorphous silicon material applied by CVD, PECVD, or metal assisted CVD of a silane, halosilane, halodisilane, polyhalosilane, or mixtures thereof, or (b) silicon-carbon ceramic material, applied by CVD or plasma enhanced CVD of a silane, halosilane, halodisilane, polyhalosilane, or mixtures thereof, and an alkane of one to six carbon atoms, or an alkylsilane, or (c) silicon-nitrogen ceramic material applied by CVD or plasma enhanced CVD of a silane, halosilane, halodisilane, polyhalosilane, or mixtures thereof, and ammonia, or (d) silicon-carbon-nitrogen ceramic material applied by CVD or plasma enhanced CVD of hexamethyldisilazane or CVD or plasma enhanced CVD of a mixture of silane, alkane and ammonia or a mixture of alkylsilane and ammonia.

DETAILED DESCRIPTION OF THE INVENTION

The instant invention relates of the discovery that nitrided ceramic coatings can be applied onto substrates, including, but not limited to, electronic devices and integrated circuits, to provide protection of the substrates from the environment. The nitrided ceramic coatings are prepared by ceramification, in an ammonia atmosphere, of solvent-applied films containing a mixture of hydrogen silsesquioxane resin $(HSiO_{3/2})_n$ and metal oxide precursors of zirconium, aluminum, and/or titanium. Platinum or rhodium catalysts may also be included in the films to facilitate the ceramification process.

In the instant invention, the term "ceramic" is intended to designate both conventional ceramic materials and other heat treated or pyrolyzed materials which have been substantially altered in chemical composition and physical characteristics by the heat treatment, but which may not be fully free of residual hydrogen and/or other elements representative of the materials preceramic structure. The term "electronic device" in the instant invention is intended to include, but not be limited to, electronic devices, silicon based devices, gallium arsenide devices, focal plane arrays, opto-electronic devices, photovoltaic cells, optical devices, transistor-like devices, multilayer devices, 3-D devices, silicon-on-insulator (SOI) devices, super lattice devices and the like.

The phrase "flowable solution" in the present invention should be understood to mean flowable, extrudable or pourable organic solvent solutions of mixtures comprising the catalyzed or uncatalyzed hydrogen silsesquioxane resin and a metal oxide precursor selected from the group consisting of acyloxy and alkoxy compounds of aluminum, titanium and zirconium. The term "cured" in the present invention is intended to mean coreaction and ceramification or partial ceramification of the starting material by heating to such an extent that a solid ceramic coating material is produced.

The phrase "nitrided coating" in the present invention is intended to mean metal and oxygen containing films or layers which films or layers further contains therein nitrogen. Nitrogen incorporation was found to occur in the process of the present invention. Thus, silicon oxynitrides are envisioned as possible materials to be found within the scope of the "nitrided coating" materials discussed herein.

The instant invention relates to enhanced protection of substrates such as electronic devices by the low temperature formation of thin single-layer or multilayer ceramic coatings on the surface of the substrates. According to the present invention, the electronic device is first coated with a solution of a mixture of a metal oxide precursor and hydrogen silsesquioxane resin, $(HSiO_{3/2})_n$ wherein n is an integer indicating the degree of polymerization and typically varies from about 10 to about 1000. For example, hydrogen silsesquioxane resins having a weight average molecular weight varying from about 8,000 to about 28,000 and corresponding number average molecular weights of about 800 to about 2900, have been found useful in the practice of this invention. Hydrogen silsesquioxane resin is a known material which can be prepared by the method described in U.S. Pat. No. 3,615,272 which is hereby incorporated by reference.

Metal oxide precursors are combined with hydrogen silsesquioxane resin in an organic solvent to prepare flowable solution for coating substrate surfaces. A single metal oxide precursor may be combined with the hydrogen silsesquioxane resin or mixtures of two or three metal oxide precursors may be combined with the resin. For the purposes of this invention, metal oxide precursors are compounds of aluminum, zirconium, or titanium which are soluble in organic solvents. Such soluble metal compounds include alkoxy and acyloxy compounds of aluminum, zirconium, and titanium.

Depending on the valance of the metal, the soluble metal compounds may have up to four alkoxy or acyloxy groups bonded to the metal. For the purposes of this invention it is only necessary that the metal compound have a number of acyloxy or alkoxy groups such that the compound is sufficiently soluble in an organic solvent. The selection of specific acyloxy or alkoxy groups is not critical since the groups are fugitave in the sense that they are either ultimately hydrolyzed or pyrolyzed during the ceramifying heat treatment that converts the coating components to nitrided metal oxides. Typical acyloxy and alkoxy groups include, for example, isobutoxy, isopropoxy, acetylacetonate, n-propoxy, stearate, propanoate, and hexoxy. Useful metal oxide precursors include, for example, tetraacetylacetonate zirconium, $Zr(OC(CH_3)=CHC(O)CH_3)_4$, dibutoxydiacetylacetonate titanium, $Ti(OC_4H_9)_2(OC(CH_3)=CHC(O)CH_3)_2$, aluminum acetylacetonate, $Al(OC(CH_3)=CHC(O)CH_3)_3$, and tetraisobutoxy titanium, $Ti(OCH_2CH(CH_3)_2)_4$.

Generally, metal oxide precursors are combined with hydrogen silsesquioxane resin in proportions such that, after the ceramifications, the combined content of metal oxides of aluminum, zirconium, and/or titanium will vary from about 0.1 to about 30 precent by weight of the ceramic residue. It should be understood that specific proportions of metal oxide precursors appropriate to provide a given level of aluminum, zirconium, and/or titanium oxide in the final ceramic coating will vary depending on the size of the acyloxy and/or alkoxy groups present in the metal oxide precursor compound. Appropriate proportions can generally be determined by calculations based on the equivalents of aluminum, zirconium, and/or titanium oxide represented by the precursor compounds and the corresponding equivalents of silicon dioxide represented by the hydrogen silsesquioxane resin.

Exemplary formulations of the instant invention of uncatalyzed planarizing coatings pyrolyzed in ammonia include, but are not limited to, those depicted in Table I.

TABLE I
Composition of Some Planarizing Coatings of the Instant Invention

| Sample No. | $SiO_2$ wt. % | $ZrO_2$ wt. % | $TiO_2$ wt. % | $Al_2O_3$ wt. % |
|---|---|---|---|---|
| 1 | 90 | 10 | | |
| 2 | 100 | | | |
| 3 | 90 | | 10 | |
| 4 | 74.7 | | | 25.3 |
| 5 | 80 | 10 | 10 | |
| 6 | 70 | 10 | 10 | 10 |
| 7 | 80 | | 20 | |
| 8 | 70 | | 30 | |
| 9 | 80 | 20 | | |
| 10 | 70 | 30 | | |
| 11 | 70 | | | 30 | wt. % is weight percent

The mixture of hydrogen silsesquioxane resin and metal oxide precursor is diluted in a solvent to both mix the components and facilitate coating the substrate. It is generally preferred to dilute the resin mixture with a solvent such as n-heptane or toluene to about 0.1 to about 85 percent solids by weight. One advantage of the hydrogen silsesquioxane resin, especially in regard to coating sensitive electronic devices, is that it is prepared from carbon free trihalosilane monomers so that the potential for carbon contaminants in coatings derived from it is minimized. The mixture of hydrogen silsesquioxane resin and metal oxide precursors can be coated on substrates and cured without the presence of any catalyst. However, the inclusion of platinum catalysts, such as, for example, $[(CH_3CH_2)_2S]_2PtCl_2$, and $Pt[OC(CH_3)=CHC(O)CH_3]_2$, or rhodium catalyst, such as $RhCl_3[(CH_3CH_2CH_2CH_2)_2S]_3$, in the resin enhances the oxidation and cure of the $(HSiO_{3/2})_n$ coating. The platinum catalysts and rhodium catalysts operative in the present invention include, but are not limited to, $[(CH_3CH_2)_2S]_2PtCl_2$, platinum acetylacetonate, and rhodium catalyst $RhCl_3[(CH_3CH_2CH_2CH_2)_2S]_3$, obtained from Dow Corning Corporation, Midland, MI. Any platinum or rhodium compound or complex which can be solubilized in the hydrogen silsesquioxane resin will serve to catalyze the cure and is within the scope of this patent.

Generally, the amount of platinum or rhodium catalyst used can be varied widely, however, it is usually preferred to use sufficient catalyst compound to provide 2 ppm to 1000 ppm of the metal based on the amount of resin in the composition. It is even more preferred to use appropriate levels of catalyst compound to provide 15 to 60 ppm of the metal. The platinum or rhodium catalyst can be added to the mixture of hydrogen silsesquioxane resin and metal oxide precursors in an amount of, for example, 60 parts per million of platinum as $[(CH_3CH_2)_2S]_2PtCl_2$. The platinum and/or rhodium catalysts also assist in the reduction or elimination of residual SiH and SiOH functionality on the $(HSiO_{3/2})_n$ resin during subsequent cure and thereby increase the production of $SiO_2$.

Furthermore, the presence of catalysts in the hydrogen silsesquioxane resin significantly reduces the weight loss observed during heat treatment in the ammonia atmosphere. For example, a reduction in weight of 6 percent during heat treatment was observed when a platinum catalyst was used in the resin. It is believed this low degree of weight loss is indicative of improved cross linking of the resin to form higher molecular weight polymers with higher char yields, a feature important in cermification. Furthermore, other ceramification experiments run in ammonia on the uncatalyzed and platinum catalyzed silsesquioxane resin demonstrate a 28% weight loss in the former but only a 4.6% weight loss in the latter. The higher ceramic char yields obtained with the catalyzed resins are an important advantage of one embodiment of the present invention.

The catalyzed or uncatalyzed solution of a mixture of hydrogen silsesquioxane resin and metal oxide precursor is coated onto an electronic device and the solvent allowed to evaporate by drying at ambient or elevated temperatures. The process of coating the resin mixture onto the electronic device can be, but is not limited to, spin coating, dip coating, spray coating, or flow coating with spin coating usually preferred.

The polymer coating is then cured and ceramified by heating the coated device, for example, for approximately one hour at 400° C. in an ammonia atmosphere. Generally, it is preferred to effect the heat treatment in an atmosphere of anhydrous ammonia that is essentially free to other components. The use of such an atmosphere improves the effectiveness of the ammonia and extent of nitridation that is obtained at a given temperature and time of treatment. It should be understood however that lesser amounts of ammonia such as less than atmospheric pressures of ammonia or mixtures of ammonia and other noninterfering gaseous components can be used in the process of the present invention. Of course, pressures of ammonia above atmospheric may also be used so long as the ammonia remains in the gaseous state. Any gaseous atmosphere containing sufficient ammonia to effect nitridation of the coating during the heat treatment can be used in the present invention. For the purposes of this invention an atmosphere containing sufficient ammonia to effect nitridation during heat treatment will be referred to as a "substantially ammonia" atmosphere.

Continuous, crack-free films of nitrided metal oxide ceramic are formed on the surface of substrates by the procedures of this invention. The films can be formed up to about 2 microns thickness without observable cracks or defects. Typically, it is preferred when coating electronic circuits to use films of about 0.3 to 0.5 microns thickness. Such films are preferred because they minimize the possiblity of cracking and defects resulting from thermal stresses, but have sufficient thickness to provide substantial planarizing or smoothing of the irregular features on the surface of electronic circuits.

This smoothing or planarizing effect is needed so that subsequent coatings of other components can be applied which are not typically useful on highly irregular surfaces. The smoothing effect of this layer tends to minimize the mechanical stresses caused by irregular topography often found on the surface of such substrates as integrated circuit devices. By minimizing such stresses, microcracking of a subsequently applied passivation coating layer is reduced or eliminated under thermal cycling conditions and the life of the integrated circuit device is increased.

An important feature of the present invention is the utilization of ammonia in the pyrolytic elimination of SiH and SiOH during the heat treatment of preceramic coatings of hydrogen silsesquioxane and metal oxide precursors. This heat treatment is an ammonia atmosphere produces coatings essentially free of SiH and SiOH. Infrared analyses of coatings prepared on potassium bromide crystal plates by pyrolysis of hydrogen silsesquioxane resin in ammonia indicated an improved efficiency and effectiveness in the removal of residual SiH and SiOH moieties in comparison to similar coatings pyrolyzed in air. The addition of ammonia is believed to create an atmosphere more reactive than air toward the pyrolytic elimination of SiH and SiOH.

Furthermore, by pyrolyzing the catalyzed or uncatalyzed mixture of hydrogen silsesquioxane resin and metal oxide precursors in ammonia, nitrogen is incorporated into the ceramic or ceramic-like metal oxide coating. The nitridation in the process of the present invention resulted in approximately 1 to 2 weight percent nitrogen incorporation. It is believed that nitrogen incorporation may result from formation of silicon oxynitride as a component of the coating.

An advantage of the process of the present invention over the state-of-the-art processes is the ability of the hydrogen silsesquioxane coatings to be cured by heat treatment in the presence of ammonia at temperatures as low as 200° to 400° C. This temperature range is significantly lower than that of the prior art. Thus in its broadest embodiment, the process of the present invention is the pyrolysis of the coating of $(HSiO_{3/2})_n$ resin and metal oxide precursor in an ammonia atmosphere at a temperature between 200° and 1000° C. But in a much more preferred embodiment, the process of the present invention is the pyrolysis of the coating of $(HSiO_{3/2})_n$ resin and metal oxide precursor in an ammonia atmosphere at a temperature in the range from 200° up to and including 400° C.

The present invention further relates to a process for forming on a substrate a ceramic coating which process comprises: (A) applying a flowable solution of a mixture of hydrogen silsesquioxane resin and metal oxide precursor to the substrate; (B) drying the resin solution to deposit a $(HSiO_{3/2})_n$ and metal oxide precursor coating on the substrate; and, (C) heating the coated substrate in a substantially ammonia atmosphere to a temperature sufficient to produce a ceramic coating on the substrate. The phrase "drying the resin solution" herein means evaporation of the organic solvent in the flowable solution of hydrogen silsesquioxane resin. The choice of substrates to be coated by the instant invention is limited only by the need for thermal and chemical stability of the substrate.

The instant invention further relates to the discovery that these nitrided metal oxide ceramic coatings can be coated with various silicon, silicon-carbon, silicon-nitrogen, or silicon-carbon-nitrogen containing materials for the still further protection of sensitive substrates such as electronic devices or integrated circuits. Correspondingly, the instant invention also relates to a process for forming on a substrate a multilayer, ceramic coating which process comprises applying a second passivating coating to substrate previously coated with the ceramified mixture of hydrogen silsesquioxane resin and metal oxide precursor. The passivation layer prevents ionic impurities from entering the electric field of coated substrates such as an integrated circuit device.

The passivating coating may comprise, for example, a ceramic film produced by diluting a preceramic polymer in a solvent, coating the device with the diluted preceramic polymer solution, drying the diluted preceramic polymer solution so as to evaporate the solvent and thereby deposit a coating of the preceramic polymer on the device, and heating the coated device in an inert or ammonia containing atmosphere to a temperature sufficient to ceramify the second coating on the device.

Any preceramic polymer can be used to prepare a passivating layer as described above so long as the polymer can be dissolved in a solvent suitable for use as a coating medium. Suitable preceramic polymers include, for example, polymers which are known precursors for silicon-carbide ceramic material such as polycarbosilanes and organopolysilanes. The polycarbosilanes can be prepared by thermolysis of polydimethylsilanes, thermolysis of organosilane monomers, or potassium-dechlorination of chloromethyl- or vinylsilanes with other methylchlorosilanes. The polycarbosilanes and their preparations are further described in U.S. Pat. Nos. 4,052,430, 4,414,403, 4,497,787, and 4,472,591 and Ger. Offen. 2,236,078 which are hereby incorporated by reference. The organopolysilanes can be prepared by sodium-dechlorination of di(mixed-organo)dichlorosilanes or by redistribution of methylchlorodisilanes. The organopolysilanes, various derivatives of organopolysilanes, and preparations are further described in U.S. Pat. Nos. 4,260,780, 4,324,901, 3,310,651, 4,310,482, 4,298,559, 4,546,163, 4,298,558, 4,310,481, and 4,314,956 which are hereby incorporated by reference.

Other suitable preceramic polymers include, for example, polymers which are known precursors for silicon-nitride ceramic material such as polyxilazanes prepared by ammonolysis of dichlorosilane as described by Seyferth et al. in U.S. Pat. No. 4,397,828 which is hereby incorporated by reference.

Still other suitable preceramic polymers include, for example, polymers which are known precursors for silicon-carbon-nitrogen ceramic material such as silsesquiazanes and carbon substituted polysilazanes. Silsesquiazanes can be prepared by ammonolysis of organotrichlorosilane, aminolysis of $CH_3SiCl_3$ and $SiCl_4$, and silazanolysis of $CH_3SiCl_3$ and $HSiCl_3$. Carbon substituted polysilazanes can be prepared by ammonolysis of $CH_3HSiCl_2$ or methylchlorodisilanes, by aminolysis of $H_2SiCl_2$, by thermal redistribution of methylchlorodisilanes with hexamethyldisilazane, or by thermal redistribution of trichlorosilane with hexaorganodisilazane of cyclic organosilazanes. The silsesquiazanes and carbon substituted polysilazanes are known materials which are further described in U.S. Pat. Nos. 3,892,583, 3,853,567, 4,312,970, 4,482,669 4,395,460, 4,340,619, 4,482,689, 4,543,344, and 4,540,803 which are hereby incorporated by reference.

Polysilacyclobutasilazanes are also useful as ceramic precursor polymers for formation of a passivation coating layer. Polysilacycloibutasilazanes are prepared by reacting 1,1-dichloro-1-silacyclobutane with a difunctional nucleophile such as ammonia, hydrazine, or a diamine. An especially preferred polymer is prepared by reacting 1,1-dichloro-1-silacyclobutane with ethylenediamine in methylene chloride (solvent) in the presence of triethylamine (acid acceptor).

The formation of a passivating coating layer is specifically exemplified as follows for a preferred embodiment wherein a polysilazane prepared by the method described in U.S. Pat. No. 4,540,803 is used as the precursor for formation of a silicon-carbon-nitrogen ceramic layer. The preceramic polymer is diluted (e.g., 0.1 to 50 weight %) in an organic solvent such as toluene or n-heptane. The polymer solution is coated (by any convenient method such as spin coating) onto an electronic device over the previously applied planarizing coating. The solvent is allowed to evaporate by drying in an inert or ammonia containing atmosphere. The preceramic polymer coating is then ceramified by heating the coated device for approximately one hour at temperatures up to 400° C. under argon. Thin ceramic passivating coatings of less than 2 microns (preferably approximately 0.3 to 0.5 microns) are thus produced on devices.

The preferred temperature range for ceramifying or partially ceramifying preceramic polymer is from 200° to 400° C. A more preferred temperature range for ceramifying preceramic polymer is from 300° to 400° C. The method of applying the heat for the ceramification or partial ceramification of the preceramic coating is not limited to conventional thermal methods. Also, the present invention is not limited to ceramification temperatures below 400° C. Ceramification techniques utilizing temperatures up to and including at least 1000° C. will be obvious to those skilled in the art, and are useful in the present invention where the substrate can withstand such temperatures.

The second or passivating coating may also comprise a CVD or PECVD applied silicon containing coating, silicon-carbon containing coating, silicon-nitrogen containing coating or silicon-carbon-nitrogen containing coating, or a combination of these coatings. A material composed primarily of silicon can be deposited by the CVD or plasma enhanced CVD of silane, halosilanes, polyhalosilanes, or halodisilanes. Silicon-nitrogen containing material can be deposited by the CVD or plasma enhanced CVD of a silazane or cyclosilazane $(H_2SiNH)_x$, by the CVD or plasma enhanced CVD of either carbosilazane or polysilacyclobutasilazane combined with ammonia, or by the CVD or plasma enhanced CVD of the products formed by reacting either siline, halosilanes, polyhalosilanes, or halodisilanes with ammonia. Silicon-carbon containing material can be deposited by the CVD or plasma enhanced CVD of the products formed by reacting either silane, halosilanes, polyhalosilanes, or halodisilanes with an alkane of one to six carbon atoms. Silicon-carbon-nitrogen containing material can be deposited by the CVD or PECVD of either hexamethyldisilazane or carbosilazane in an ammonia atmosphere, by the CVD or PECVD of cyclosilazane, silazanes, or the CVD or PECVD of mixtures of either a silane or an alkylsilane with an alkane of one to six carbon atoms, and ammonia.

For the still further protection of sensitive substrates such as electronic devices or integrated circuits, it may also be advantageous to apply a barrier coating over the top of the planarizing and/or passivating coating layers of this invention. The barrier coating layer is intended to hermetically seal the substrate surface from all external influences including any form of water, organic vapor, and ionic impurities. Preferred components for use in fashioning the barrier layer include dense amorphous silicon, silicon carbide, silicon nitride, and silicon-carbon-nitrogen ceramic materials, with dense amorphous silicon being most preferred.

The barrier coating is generally applied by a CVD or plasma enhanced CVD process. Barrier coatings can be applied by any or the CVD or plasma enhanced CVD processes previously described above for application of the passivation coating layer. However, it is preferred to form a silicon containing third layer or topcoat at a relatively low reaction temperature by the metal-assisted CVD process claimed in the co-pending U.S. Patent Application, Ser. No. 835,029, mentioned supra. The metal assisted CVD process is particularly suited for the deposition of coatings from $SiCl_4$, $SiBr_4$, $HSiI_3$, $HSiCl_3$, and $HSiBr_3$.

Single layer or multilayer coatings produced by the instant invention possess low defect density and are useful on electronic devices as protective coatings, as corrosion resistant and abrasion resistant coatings, as temperature and moisture resistant coatings, and as a diffusion barrier against ionic impurities such as $Na^+$ and $Cl^-$. The coatings of the present invention are also useful for functional purposes in addition to protection of electronic devices from the environment. The coatings of the present invention are useful, for example, as interlevel dielectric layers, multilayer devices, 3-D devices, compact discs, optical discs, optically readable devices and surfaces, silicon-on-insulator (SOI) devices, superconducting devices, and super lattice devices. More specifically, ceramic coatings of nitrided mixtures of silicon oxide and aluminum, zirconium, and/or titanium oxides are useful as interlevel dielectrics within the body of the electronic device and between the metallization layers.

Another unique aspect of the coatings produced by the present invention is their transparency to electromagnetic radiation. Thus a particular advantage of the coatings of the present invention is utilization on focal plane arrays, photovoltaic cells, or opto-electronic devices in which electromagnetic radiation can pass into or emanate from the coated device. The following examples are presented to illustrate the invention to those skilled in the art and should not be construed as limiting the invention, which is properly delineated in the appended claims. All proportions by parts or percents are by weight unless otherwise stated.

EXAMPLE 1

Ceramification of Hydrogen Silsesquioxane Resin and $Zr(OC_3H_7)_4$ in Ammonia

A mixture containing 0.8% hydrogen silsesquioxane resin, $(HSiO_{3/2})_n$, produced by the method of Frye, et al., supra, and 0.63% zirconium tetrapropoxide, $Zr(OC_3H_7)_4$, was prepared in n-heptane and allowed to remain at room temperature for 4 days. The diluted mixture was then flow coated onto a Motorola 14011B CMOS electronic device and the solvent allowed to evaporate. A 2 inch Lindberg furnace was flushed with anhydrous ammonia gas for 20 minutes to provide an ammonia atmosphere essentially free of other components. The deposited coating was ceramified by heating the coated device in the ammonia atmopshere in the furnace for one hour at 400° C. A thin ceramic nitrided $SiO_2/ZrO_2$ coating was produced on the device. After pyrolysis, examination of the coated device at 40x magnification showed the coating to be of good optical quality with no coating cracks or defects. The coated device passed the go/no go test on the Teradyne Analogical Circuit Test Instrument J133C equipped with a CMOS 4000 AE Series Family Board and a CMOS 4011 A Quad 2 Input Nand Gate Device Board.

EXAMPLE 2

Ceramification of Hydrogen Silsesquioxane Resin and $Ti(OCH(CH_3)_2)_4$ in Ammonia A mixture containing 0.87% hydrogen silsesquioxane resin, $(HSiO_{3/2})_n$, and 0.83% tetraisopropoxy titanium, $Ti(OCH(CH_3)_2)_4$, was prepared in n-heptane. The solution was allowed to stand at room temperature for 4 days. The dilute solution was then flow coated onto an electronic device and the solvent allowed to evaporate. The deposited coating was ceramified by heating the coated device in ammonia for one hour at 400° C. A thin nitrided $SiO_2/TiO_2$ coating was produced on the device.

EXAMPLE 3

Ceramification of Hydrogen Silsesquioxane Resin and Aluminum Trispentanedionate in Ammonia A coating solution of 0.8% hydrogen silsesquioxane resin and 0.62% aluminum trispentanedionate was prepared in methyl ethyl ketone and the solution allowed to stand at room temperature for 4 days. A Motorola 14011B CMOS device was flow coated with the solution, air dried for 10 minutes, then pyrolyzed at 400° C. in ammonia for 1 hour. The coated device passed the Teradyne CMOS test described in Example 1.

EXAMPLE 4

Ceramification of Hydrogen Silsesquioxane Resin and $Ti(OCH_2C(CH_3)_2)_4$ and $Zr(OCH_2CH_2CH_3)_4$ in Ammonia A mixture containing 80% hydrogen silsesquioxane resin, $(HSiO_{3/2})_n$, 10% tetraisobutoxy titanium, $Ti(OCH_2C(CH_3)_2)_4$, and 10% tetrapropoxy zirconium, $Zr(OCH_2CH_2CH_3)_4$, can be prepared at low solids, 1.0%, in methyl ethyl ketone. The solution should be allowed to stand at room temperature (1 to 4 days) until it affords a clear coating upon air drying. The dilute solution can be flow coated onto an electronic device and the solvent allowed to evaporate by drying. The deposited coating should be ceramified by heating the coated device in ammonia for approximately twenty hous at 200° C. or for one hour at 400° C. A thin ceramic nitrided $SiO_2/TiO_2/ZrO_2$ coating will be produced on the device.

EXAMPLE 5

Ceramification of Hydrogen Silsesquioxane Resin and Tetraisobutoxy Titanium, $Ti(OCH_2C(CH_3)_2)_4$ and $Al(CH_3COCH_2COCH_3)_3$ in Ammonia A mixture containing 70% hydrogen silsesquioxane resin, $(HSiO_{3/2})_n$, 10% tetraisobutoxy titanium, $Ti(OCH_2C(CH_3)_2)_4$, 10% tetrapropoxy zirconium, $Zr(OCH_2CH_2CH_3)_4$, and 10% aluminum trispentanedionate, $Al(CH_3COCH_2COCH_3)_3$ can be prepared at low solids, 1.0%, in methyl ethyl ketone. The solution should be allowed to stand at room temperature (1 to 4 days) until it affords a clear coating upon air drying. The solution can be flow coated onto an electronic device and the solvent allowed to evaporate by drying. The deposited coating should be ceramified by heating the coated device in ammonia for approximately twenty hours at 200° C. or for one hour at 400° C. A thin ceramic nitrided $SiO_2/TiO_2/ZrO_2/Al_2O_3$ coating will be produced on the device.

EXAMPLE 6

Ceramification In Ammonia of Hydrogen Silsesquioxane Resin and Zirconium Tetraisopropoxide With Platinum Catalysts A mixture containing 0.8% hydrogen silsesquioxane resin, $(HSiO_{3/2})_n$, produced by the method of Frye, et al., supra, and 0.63% zirconium tetrapropoxide, $Zr(OC_3H_7)_4$, was prepared in n-heptane and allowed to stand at room temperature for 4 days. The solution was catalyzed by adding 0.01 g of toluene in which was dissolved 17 ppm based on the amount of resin of platinum as $(CH_3CH_2S)_2PtCl_2$. The catalyzed solution was then spin coated onto a Motorola 14011B CMOS electronic device. The deposited coating was ceramified by heating the coated device in ammonia in a two inch Lindberg furnace for 1 hour at 400° C. A thin ceramic nitrided $SiO_2/ZrO_2$ coating was produced on the devices. The coated device passed the go/no go test on the Teradyne Analogical Circuit Test Instrument J133C equipped with a CMOS 4000 AE Series Family Board and a CMOS 4011 A Quad 2 Input Nand Gate Device Board.

EXAMPLE 7

Ceramification In Ammonia of Hydrogen Silsesquioxane Resin and Tetraisobutoxy Titanium With Rhodium Catalysts A mixture (10 ml) containing 90% hydrogen silsesquioxane resin, $(HSiO_{3/2})_n$, and 10% tetraisobutoxy titanium, $Ti(OCH_2CH(CH_3)_2)_4$, can be prepared in n-heptane at a concentration of 1%. The solution can be catalyzed by adding 0.01 g of 0.5% $RhCl_3[(CH_3CH_2CH_2CH_2)_2S]_3$ in n-heptane, obtained from Dow Corning Corporation. The catalyzed solution should be allowed to stand at room temperature (1 to 4 days) until it affords a clear coating upon air drying. The solution can be flow coated onto an electronic device and the solvent allowed to evaporate by drying. The deposited coating should be ceramified by heating the coated device in an ammonia atmosphere for approximately twenty hours at 200° C. Alternatively, coated devices can be heated in an ammonia atmosphere for one hour at 400° C. A thin nitrided $SiO_2/TiO_2$ coating will be produced on the devices.

EXAMPLE 8

Chemical Analysis of Ceramified Coating

A mixture of hydrogen silsesquioxane resin (0.75 g) and aluminium trispentanedionate (0.75 g) was prepared in methylethylketone solution. The solvent was evaporated at room temperature and the remaining solids were pulverized to a fine powder. Portions of the powder (0.5 g) were heated at 400° C. for 1 hr in either air or ammonia. The ammonia pyrolysis was carried out in a 2 inch Lindberg furnace as described in Example 1. The air pyrolysis was carried out in a 12 inch Lindberg furnace. Table 1 shows the yield of ceramic material after pyrolysis and the amount of carbon, hydrogen, and nitrogen found in the ceramic material.

TABLE 1

| Atmosphere | yield | carbon | hydrogen | nitrogen |
|---|---|---|---|---|
| air | 0.284 | 1.09 | 0.1 | not detected (<0.1) |
| ammonia | 0.297 | 3.74 | 0.49 | 1.62 |

The data in Table 1 demonstrates that nitrogen is incorporated into the ceramic material when the hydrogen silsesquioxane and aluminum trispentanedionate mixture is heated in an ammonia atmosphere.

EXAMPLE 9

Application of Dual-Layer Coating to an Electronic Device

Two Motorola 14011-B CMOS devices were spin coated with a cyclohexanone solution containing 0.7 wt. % hydrogen silsesquioxane resin and 0.95 wt. % aluminium trispentanedionate at 2000 rpm. After the solvent was evaporated the devices were heated to 400° C. in an ammonia atmosphere for 2 hr to ceramify the coatings.

A second coating layer was applied to the devices by spin (5000 rpm) coating a 5 wt. % solution in toluene of a preceramic polysilazane polymer. The polysilazane polymer was prepared by reacting $HSiCl_3$ and hexamethyldisilazane followed by neutralization with ammonia according to the procedure described in Example 1 in U.S. Pat. No. 4,540,803. After the solvent was evaporated the devices were heated to 400° C. in an ammonia atmosphere for 2 hr to ceramify the coatings. Examination of the coated devices at 15x magnification showed the coating layers to be of good optical quality with no visible cracks or defects. The devices were found to be fully functional when tested according to the Teradyne CMOS test described in Example 1.

EXAMPLE 10

Ceramification of Silizane Polymer Passivating Coating

If preceramic silazane polymer, prepared by the method of Cannady in Example 1 in U.S. Pat. No. 4,540,803, is diluted to 1.0% in toluene, it can be spin coated onto the coated electronic devices of Examples 1 through 7. The solvent should be allowed to evaporate in the absence of air. The deposited coating of preceramic polymer can be ceramified by heating the coated device for approximately one hour at 400° C. under argon. Thin silicon-nitrogen ceramic coatings will be produced on the devices. The example can be repeated except that ammonia is substituted for the argon atmosphere. No adverse effects will be noted in the coatings produced.

EXAMPLE 11

Ceramification of a Titanium-Containing Silazane Polymer Passivating Coating

If a preceramic silazane polymer containing about 5% titanium, prepared by the method of Haluska in Example 13 in U.S. Pat. No. 4,482,689, is diluted to 1.0% in toluene, it can be spin coated onto the nitrided $SiO_2$/metal oxide coated electronic devices produced by the methods of Examples 1 and 2. The solvent should be allowed to evaporate. The deposited coating can be ceramified by heating the coated device for approximately one hour at temperatures up to 400° C. under nitrogen. Thin silicon-nitrogen-titanium ceramic coatings will be produced on the coated devices.

EXAMPLE 12

Ceramification of Silazane Polymer Passivating Coating

If a preceramic silazane polymer, prepared by the method of Gaul in Example 1 in U.S. Pat. No. 4,395,460, is diluted to 1.0% in toluene, it can be coated onto a nitrided $SiO_2$/metal oxide coated electronic device. The solvent should be allowed to evaporate. The deposited coating can be ceramified by heating the coated device for approximately one hour at temperatures up to 400° C. under argon. Thin silicon-nitrogen ceramic coatings will be produced on the devices.

EXAMPLE 13

Ceramification of A Dihydridosilazane Polymer Passivating Coating

A 1–2% solution in diethyl ether of dihydridosilazane polymer, prepared by the method of Seyferth in Example 1 in U.S. Pat. No. 4,397,828, can be flow coated onto Motorola 14011B CMOS electronic devices previously coated by the methods of Examples 1-7, above. The devices should be heated in ammonia for one hour at 400° C. The coating and pyrolysis treatment will not adversely affect the function of the devices, as determined by a CMOS circuit tester. The coated devices will withstand 0.1M NaCl exposure for over four hours before circuit failure. A non-protected CMOS device will fail to function after exposure to a 0.1 M NaCl solution for less than one minute.

EXAMPLE 14

CVD Barrier Coat From $F_3SiSiF_3$

Electronic devices coated with the planarizing and/or passivating coatings of Examples 1 through 11 can be overcoated with barrier coats as follows; hexafluorodisilane, 50 Torr, can be placed in a previously evacuated Pyrex ® glass container along with a Motorola 14011B CMOS electronic device, previously coated as in Examples 1-11, above. The hexafluorodisilane should be transferred to the glass container in such a manner as to preclude exposure to the atmosphere. The container should be heated in an oven for 30 minutes at a temperature of approximately 360° C. During this time the hexafluorodisilane decomposed and formed a topcoat containing silicon on the electronic device. The by-products, mixtures of various halosilanes, and any unreacted starting material can be removed by evacuation after the container has been reattached to a vacuum line. The electronic device will pass the Teradyne CMOS test described in Example 1.

That which is claimed is:

1. A process for forming on a substrate a ceramic coating which process comprises:
   (A) applying to the substrate a flowable solution of a mixture comprising hydrogen silsesquioxane resin and a metal oxide precursor selected from the group consisting of acyloxy and alkoxy compounds of aluminum, titanium, and zirconium wherein the metal oxide precursor is present in such proportion so that the metal oxide is present in the ceramic coating produced in step (C) at about 0.1 to about 30 percent by weight;
   (B) drying the resin solution to deposit a preceramic coating on the substrate; and (C) heating the coated substrate in a substantially ammonia atmosphere to a temperature sufficient to produce a ceramic coating on the substrate.

2. A process as claimed in claim 1 further comprising: (D) applying to the ceramic coating a passivating coating selected from the group consisting of (i) a silicon coating, (ii) a silicon carbon coating, (iii) a silicon-nitrogen coating, and (iv) a silicon-carbon-nitrogen coating, wherein the passivating coating is applied by a means selected from the group consisting of (a) chemical vapor deposition, (b) plasma enhanced chemical vapor deposition, and (c) application of a preceramic polymer coating and subsequent ceramification of the preceramic polymer coating.

3. A process as claimed in claim 2 further comprising: (E) applying to the passivating coating a barrier coating selected from the group consisting of (i) a silicon coating, (ii) a silicon carbon coating, (iii) a silicon-nitrogen coating, and (iv) a silicon-carbon-nitrogen coating, wherein the barrier coating is applied by a means selected from the group consisting of (a) chemical vapor deposition and (b) plasma enhanced chemical vapor deposition.

4. An article comprising a structure having thereon a coating formed by the process of claim 3.

5. An article comprising an electronic device having thereon a coating formed by the process of claim 3.

6. A process as claimed in claim 2 wherein the passivating coating is applied by means of metal assisted chemical vapor deposition.

7. A process as claimed in claim 2 wherein the barrier coating is applied by means of metal assisted chemical vapor deposition.

8. An article comprising a structure having thereon a coating formed by the process of claim 2.

9. An article comprising an electronic device having thereon a coating formed by the process of claim 2.

10. A process as claimed in claim 1 wherein the flowable solution of a mixture comprising hydrogen silsesquioxane resin and a metal oxide precursor is catalyzed with platinum catalyst.

11. An article comprising a structure having thereon a coating formed by the process of claim 10.

12. An article comprising an electronic device having thereon a coating formed by the process of claim 10.

13. A process as claimed in claim 1 wherein the flowable solution of a mixture comprising hydrogen silsesquioxane resin and a metal oxide precursor is catalyzed with rhodium catalyst.

14. An article comprising a structure having thereon a coating formed by the process of claim 13.

15. An article comprising an electronic device having thereon a coating formed by the process of claim 13.

16. A process as claimed in claim 1 wherein the temperature is 200° to 1000° C.

17. An article comprising a structure having thereon a coating formed by the process of claim 16.

18. A process as claimed in claim 1 wherein the temperature is 200° to 400° C. and the substrate is an electronic device.

19. An article comprising an electronic device having thereon a coating formed by the process of claim 18.

20. An article comprising an electronic device containing multiple layers of metalization and an interlevel layer which isolates electronic functions occurring in the metalization layers, the interlevel layer having been formed by the process of claim 18.

21. A process as claimed in claim 1 wherein the substrate is an electronic device.

22. A process as claimed in claim 1 wherein a method of applying the flowable solution onto the substrate is selected from the group consisting of spray coating, dip coating, flow coating and spin coating.

23. An article comprising a structure having thereon a coating formed by the process of claim 1.

24. An article comprising an electronic device having thereon a coating formed by the process of claim 1.

* * * * *